United States Patent [19]
Hiatt et al.

[11] Patent Number: 5,963,315
[45] Date of Patent: Oct. 5, 1999

[54] METHOD AND APPARATUS FOR PROCESSING A SEMICONDUCTOR WAFER ON A ROBOTIC TRACK HAVING ACCESS TO IN SITU WAFER BACKSIDE PARTICLE DETECTION

[75] Inventors: William Mark Hiatt, Austin, Tex.; Barbara Vasquez, Hsinchu, Taiwan; Karl Emerson Mautz, Round Rock, Tex.

[73] Assignee: Motorola, Inc., Schaumburg, Ill.

[21] Appl. No.: 08/912,726

[22] Filed: Aug. 18, 1997

[51] Int. Cl.[6] .................................................. G01N 21/88
[52] U.S. Cl. ............................................................ 356/237.3
[58] Field of Search ............................. 356/237.3, 237.4, 356/239.8

[56] References Cited

U.S. PATENT DOCUMENTS

| | | | |
|---|---|---|---|
| 4,895,446 | 1/1990 | Maldari et al. | 356/336 |
| 5,274,434 | 12/1993 | Morioka et al. | 356/237.4 |
| 5,710,624 | 1/1998 | Utamura | 356/237 |
| 5,780,204 | 7/1998 | La et al. | 430/312 |

*Primary Examiner*—Richard A. Rosenberger
*Attorney, Agent, or Firm*—Keith E. Witek

[57] ABSTRACT

The present disclosure is a method for in situ monitoring of backside contamination on a semiconductor wafer (120) between processing steps which are performed in a multichamber tool (500). In a first form, a laser source (220) and a detector (210) are mounted on a robotic arm (110, 111), or within a semiconductor processing tool (500). The laser (220) and detector (210) move along with the robotic arm (110) as the robotic arm (110) shuffles the wafer (120) between processing carriers (610–650) and chambers (510–540). While in transit the backside of the semiconductor wafer (120) is scanned by a laser beam (221), whereby contamination is detected by a detector (210). The laser (220) and detector (210) then scan the backside of the wafer (120) while the robotic arm (110) is in transit and/or while the robotic arm (110) is stationary in the processing sequence. The absolute particle count and differential/incremental particulate counts are calculated on a chamber-by-chamber, and wafer-by-wafer basis, using a data processor (230).

40 Claims, 5 Drawing Sheets

METHOD AND APPARATUS FOR PROCESSING A SEMICONDUCTOR WAFER ON A ROBOTIC TRACK HAVING ACCESS TO IN SITU WAFER BACKSIDE PARTICLE DETECTION

RELATED APPLICATION

The present invention is related to U.S. Ser. No. 08/887,696 filed on Jul. 3, 1997, entitled "Method and Apparatus for In-Line Measuring Backside Wafer Level Contamination of a Semiconductor Wafer" by Jain, et al. (still pending), which is assigned to the current assignee hereof.

FIELD OF THE INVENTION

The present invention relates generally to semiconductor manufacturing, and more particularly to, processing semiconductor wafers on a track system wherein the track exposes the backside of the wafer thereby allowing in situ particle detection access to the backside of the wafer.

BACKGROUND OF THE INVENTION

As wafer diameter increases over time and lithographic feature size reduces over time, controlling the particulate contamination on a backside of a semiconductor wafer becomes critical. This control is needed due to the fact that the lithographic depth of focus associated with the manufacture of these smaller features becomes more constrained as lithographic IC feature size shrinks. In addition, this depth of focus yield problem is exacerbated by larger wafers which are harder to maintain in a fully planar position. If the wafer, or more specifically the wafer's exposure field, cannot be maintained in a fully planar position during lithographic exposure due to the wafer backside contamination, the lithography tool cannot expose the entire wafer uniformly or accurately, causing die to be scrapped. Therefore, a need exists wherein the contamination on the backside of wafers should be monitored closely for prompt detection and correction in order to improve IC manufacturing over the next few years.

To illustrate the wafer backside contamination problem, FIGS. 1–2 are provided. Prior art FIG. 1 illustrates a semiconductor substrate 10 (wafer) after being processed using a conventional organic wafer chuck. As illustrated in FIG. 1, a contamination signature 14 has been left upon the substrate 10. The contamination signature 14 is transferred onto a backside of the semiconductor wafer simply by virtue of the wafer 10 being placed into contact with the chuck for a normal processing cycle. The contamination in FIG. 1 is the contamination which results when a chuck, that has been processing for some time but still has no visible defects which can be detected by an operator, is placed into contact with the wafer 10. The individual contaminants/particles 12, which form the contamination signature 14 on wafer 10, have been detected by a prior art ex situ laser particle system to provide the illustration of FIG. 1. As semiconductor feature sizes reach a 0.25 micron and less, the individual contaminants 12 upon a backside of the semiconductor wafer 10 will have an increasingly greater effect upon lithographic pattern yield since the depth of focus is continually decreasing as IC technology progresses. Since wafer backside contamination may result in some parts of the wafer lying outside this depth of focus during lithographic exposure processing, yield is being adversely impacted by wafer backside contamination that was previously harmless.

In order to reduce the amount of contamination upon the backside of the semiconductor substrate 10, ceramic or other inorganic wafer chuck compounds have been used. The contamination signature of one such ceramic wafer chuck is illustrated in FIG. 2. In FIG. 2, a semiconductor substrate 20 has been exposed to a ceramic chuck for a normal processing cycle. The ceramic chuck of FIG. 2 is relatively new in that approximately 100 processing cycles have occurred on the ceramic chuck utilized in FIG. 2 prior to the measurement of contamination upon wafer 20. As illustrated in FIG. 2, a pronounced contamination signature 24 is beginning to occur upon the wafer 20, even though the ceramic chuck is relatively unused. In other words, the particulates/contaminants 22 are still being deposited on the backside of the wafer 20 by simple contact between the wafer 20 and the ceramic chuck. Although the ceramic chuck may reduce backside contamination, the wafer 20 is still contaminated in a manner similar to the wafer 10 which was processed using the organic chuck in FIG. 1. Due to the migrations of wafer backside contaminants to device areas as a result of subsequent processing as well as the physical contamination on the backside of wafers, which can effect the formation of small feature sized devices as a result of their effects on the depth of focus, it is important to try to reduce wafer backside contamination beyond that illustrated in FIG. 2. Therefore, it would be advantageous to have an in situ method and apparatus for promptly detecting and correcting backside contamination on semiconductor substrates before yield is impacted or cross-contamination occurs.

One prior art method of monitoring backside contamination of semiconductor wafers is to perform a visual inspection of processing areas between the processing of individual wafers. During the visual inspection, an operator could manually inspect the wafer chuck, the handler, and other processing locations capable of contaminating the wafer, in order to determine whether or not there is any visible contamination upon the wafer chuck. The obvious limitation of this method is that it is a very subjective test whereby, depending upon the individual operator, the results vary. A further limitation of this test is that, as smaller features sizes are being developed, the ability to detect the contamination assumes that it will be visible prior to the contamination causing a problem. The yield-reducing contamination is not always visible to the human eye. Therefore, very small particles which may adversely affect state-of-the-art technology would not be detected. For example, with small feature-sized devices of a 0.25 micron or less, it is possible for a 0.1 or 0.2 micron wafer backside contaminant to cause a shift in the depth of focus field enough to adversely impact yield. In addition, an additive effect occurs in that smaller particles build upon each other to create, in effect, larger particles which cause the contamination issues previously discussed. A particle of this size would not be detectable by the human eye, yet cause substantial financial loss to an IC manufacturer.

A final limitation of the visual inspection process is the fact that it requires the processing tools to be designed such that the processing chucks are actually visible to the operator. This is a limitation in the tools and, in fact, many tools do not allow such a visual inspection to occur. Furthermore, once a single chuck or wafer is contaminated and goes undetected, this wafer or chuck could contaminate many other wafers or chucks thereby contributing to more widespread contamination. If undetected, a small area of contamination could spread to a larger area of contamination (i.e., cross-contamination has occurred).

A second prior art method of performing the contamination inspection is to actually run a test wafer through a number of processing steps in a tool. At each individual processing step, the wafer is removed from the tool, flipped over, and scanned on the wafer backside, given a wafer having a polished backside, via an ex situ laser process in order to determine the contamination introduced by the process. In order to monitor each process chamber for contamination, each wafer being processed would need to be removed, scanned and reintroduced into the tool to test yet another chamber in the tool. Alternatively, each chamber could have a dedicated wafer having a known contamination level that could be used to monitor all chambers in the tool. The limitations of this process is that a test wafer will generally be used, and that it requires removing the wafer from the processing tool in order to detect the contamination. This process also adversely affects throughput and may not detect contamination in time to avoid adverse contamination spreading in a multi-chamber processing tool. Normal wafers cannot be processed in this manner since the active surface of the wafer is typically damaged when the wafer is flipped over onto a particle scanning tool chuck. Overall, this process is very slow, inefficient, laborious and costly in a modern semiconductor manufacturing environment.

To date, conventional ex situ wafer backside particle detection is not effective or efficient. Wafer backside contamination threatens to reduce integrated circuit device yield in large wafers and/or in smaller lithographic dimensions due to lack of prompt detection and correction. A method of in situ contamination has not been developed to avoid contamination spreading within a multi-chamber tool. In a multi-chamber tool, identification of the one "problem chamber" using ex situ techniques is not efficient or accurate. Usually once a test wafer detects the contamination from a processing tool, the potential yield damage on processed wafers has already been done. To avoid these problems, many fabrication facilities frequently inactivate fabrication equipment and manually-clean the various chambers at frequent intervals to prevent a contamination problem that cannot be easily detected. This "over-maintenance" of the systems to prevent wafer backside contamination problems is costly and reduces throughput of the fabrication facility. Also, even if corrective action is taken, there is no current mechanism by which one can verify that the correction was effective without repeating the process.

Therefore, an automated methodology which is capable of efficiently detecting and correcting wafer backside contamination within a processing tool would be beneficial.

BRIEF DESCRIPTION OF THE DRAWINGS

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DESCRIPTION OF A PREFERRED EMBODIMENT

Figure 1:
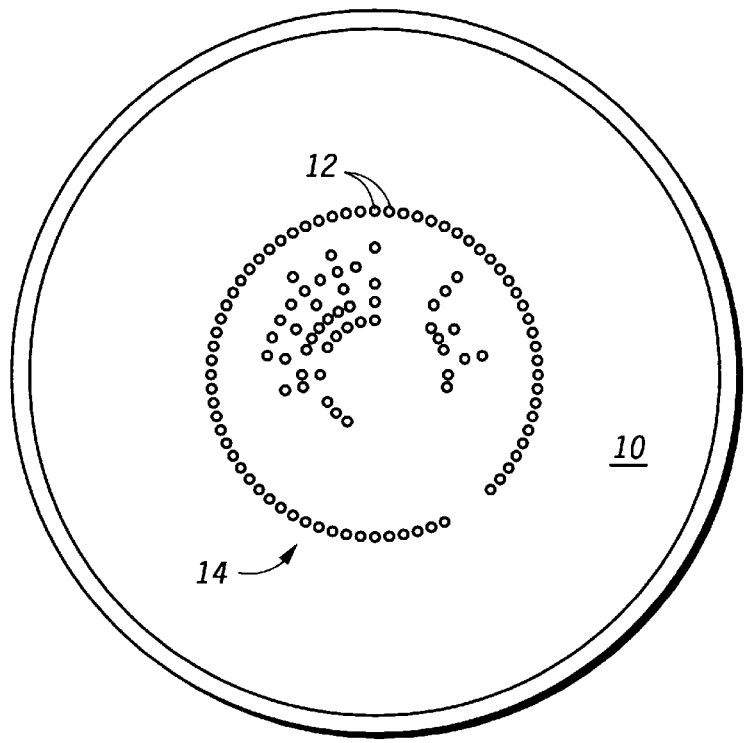
FIGS. 1 and 2 illustrate contamination signatures on the backside of semiconductor wafers.

Generally, the present invention is a method for in situ monitoring the backside of a semiconductor wafer between processing steps which are performed in a multi-chamber tool. In a first form, a laser source and a detector are mounted on a robotic arm or track within a semiconductor processing tool. The laser and detector move along with the robotic arm as the robotic arm shuffles the wafer between processing chambers. While in transit between chambers, the backside of the semiconductor wafer is scanned by a laser beam located on the robotic arm whereby laser scattering is detected by a detector located on the robotic arm. The laser and detector then particle scan the backside of the wafer while the robotic arm is in transit and/or while the robotic arm is stationary between processing chambers in the processing sequence. The absolute particle count and differential/incremental particulate counts are calculated from past data on a chamber-by-chamber, wafer-by-wafer, or even transfer-by-transfer basis.

By checking wafers as they are introduced into and returned from a new tool, the contamination level can be monitored. This contamination, or particulate, data is stored and processed via computer and can be used to promptly identify a problematic wafer before cross-contamination occurs and before IC yield is impacted. In situ detection as taught herein also promptly determines the source of the contamination (i.e., the last chamber used for processing). Once contamination is promptly detected, the backside contamination on the wafer can be corrected by a cleaning or a redo process, unlike the ex situ processing taught by the prior art. In addition, when a wafer is determined to be contaminated, the chamber or chambers causing the contamination need be cleaned in order to prevent continued contamination. The process taught herein is fast, efficient, enhances yield, does not adversely impact tool throughput, reduces equipment down-time, and enables future advances in reduced feature size and wafer size increases.

Another embodiment is to design a specific area within the multi-chamber tool which is used for particle detection on the backside of the wafer. This area is not attached to the robotic arm as discussed above wherein the particle detection area is fixed and the robotic arm must bring the wafers to this particle detection area within the multi-chamber tool. The robotic arm takes the wafer from the chamber, performs particle detection on the backside of the wafer in the designated particle detection area and then transports the wafer to the next chamber for processing. This embodiment does not encumber the robot arm or render the robotic interface more bulky, but it may slightly reduce throughput due to added robotic arm travel time. Furthermore, the in situ particle scanning method taught herein may be customized to scan only a designated area of the wafer backside wherein this designated area is an area most likely to be contaminated by a specific processing tool. In addition, a previously qualitative particle inspection process is now able to become quantitative, which allows improved process control and eliminates human subjectivity. Numerical data processing in wafer backside particle detection was not feasible or possible using prior art techniques. Therefore, a computer can now determine from the particle scanning data when the wafer backside contamination is beyond specification, stop processing wafers through that specific problematic chamber, and initiate corrective action automatically. Also, automatic verification that the corrective action was successful is also possible.

The invention can be further understood with reference to FIGS. 3–7.

Figure 3:
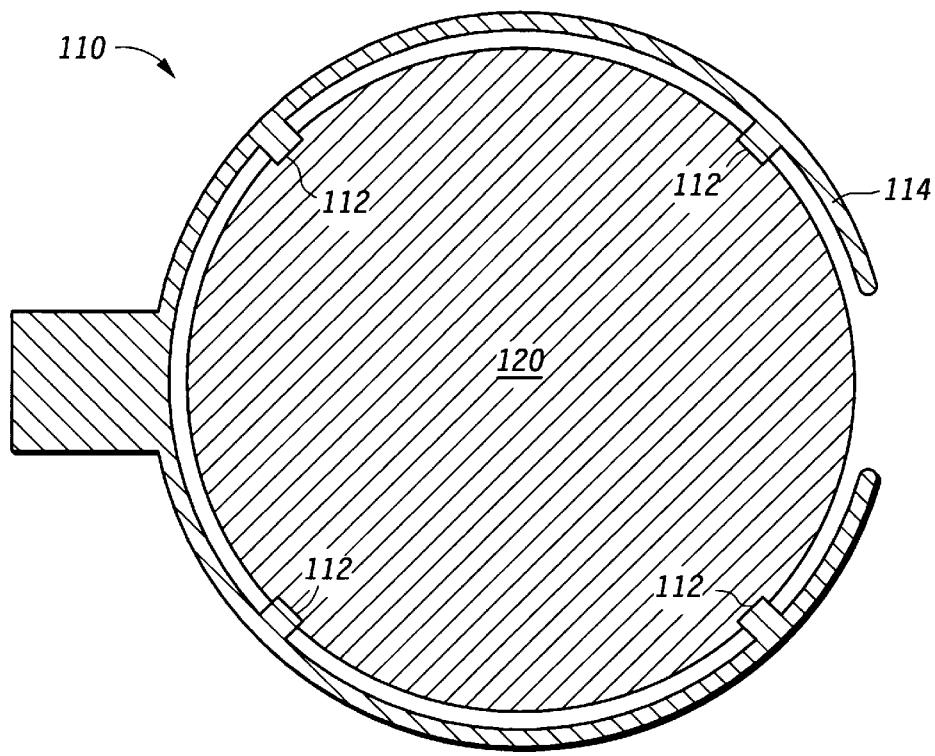
FIG. 3 illustrates, in plan view, a robotic arm supporting a semiconductor substrate.

FIG. 3 illustrates a robotic arm 110. The robotic arm 110 has a ring portion 114. In one embodiment, the ring portion 114 has an opening in the front of the arm whereby individual semiconductor wafers can be picked up and returned to the arm automatically. The robotic arm 110 also has pins 112 at a bottom of the ring portion 114 which are used for physically holding/supporting the semiconductor substrate 120 through the use of gravity. It is important to note that the robotic arm 110 is designed so that the backside of the semiconductor substrate 120 is open and exposed to underlying objects. Only small overlap areas of the wafer 120 and the pins 112 will not be available for backside scanning/processing. Therefore, minimization of the overlap allows the maximum wafer backside area of the wafer to be scanned. The illustration of FIG. 3 is a wafer backside view of the wafer 120 wherein a side opposite the backside of the wafer is an active area of the wafer on which active IC circuitry is formed. Therefore, the pins 112 are seen to extend to within a 3 mm edge exclusion zone in the periphery of the semiconductor wafer 120. The wafers processed herein are preferably 300 mm wafers but may be any sized semiconductor wafer or flat panel display.

Figure 4:
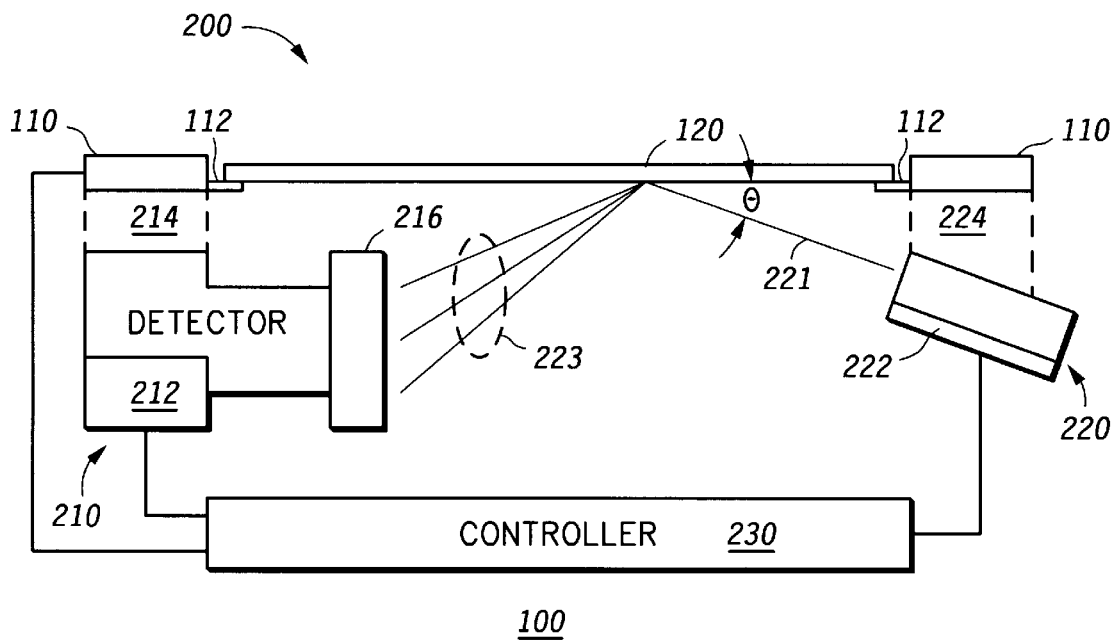
FIG. 4 illustrates, in cross sectional view, a robotics system for transporting semiconductor substrates.

FIG. 4 illustrates a side view of a backside metrology system (BMS) or robotic arm system. The backside metrology system is used for detecting contamination, such as particles, upon the backside of a semiconductor wafer which is supported in the robotic arm of FIG. 3. The backside metrology system comprises an energy source 220 (preferably a laser source), a detector 210, and a controller 230.

In operation, the laser 220 generates a laser beam 221 which is focused upon a portion of the semiconductor substrate 120. The angle (θ) at which the laser is focused upon the wafer is known as the angle of incidence and is predetermined in order to allow for optimal laser-light-scattering detection of contamination upon the wafer surface. The detector 210 has a detector portion 216 where the reflected or scattered laser beam 223 is received. Based upon the reflection pattern of the laser, as detected by the detector 210, the controller 230 can determine whether or not a contamination point exists at the location of which the laser beam is focused.

Because the laser beam will be focused at a single point at any one moment and data is needed over a two-dimensional surface (not just a point on the wafer), it will be necessary to move the laser and detector system relative to semiconductor wafer in order to detect contamination across a larger wafer surface. In one embodiment, this laser movement would be accomplished by moving the semiconductor substrate 120 relative to the preferably stationary detector and laser. This raster scan of the laser can be accomplished by moving the semiconductor substrate 120 in the X and Y axis relative to the detector and the laser, by spinning the semiconductor wafer, and also by adjusting the vertical component or Z axis of the semiconductor wafer. This type of raster scan checks substantially all of the wafer backside for contamination. It would be appreciated by one skilled in the art that it would also be possible to move the detector and the laser as well as the semiconductor substrate, or move only the laser and detector while the substrate remained stationary in space.

In an embodiment where the detector and the laser will perform raster scanning and/or require alterable positioning of the precise angles of incidence of the laser beam 221, a motor control portion 212 and 222, respectively, are shown to be connected to the controller/computer 230. Conversely, the controller 230 is shown to be connected to the robotic arm 110 for purposes of controlling the surface of the semiconductor substrate 120 relative to the laser and the detector when the detector and laser are not physically coupled to the robotic arm 110 of FIG. 3 in one embodiment. In addition, coupling portions 214 and 224 are shown for both the detector and the laser whereby, in another embodiment, the detector 210 and the laser 220 may actually be rigidly supported or physically connected to the robotic arm 110 of FIG. 3. This embodiment, wherein the detector 210, laser 220 and the robotic arm 110 are all statically connected, will be discussed in greater detail in subsequent paragraphs.

Because larger semiconductor wafers are becoming more common in the semiconductor industry, it would be expected that a certain amount of bowing would occur on the semiconductor substrate being tested. It would be necessary to compensate for this bowing by use of the controller 230. In general, the bowing could be characterized and have a predetermined component whereby, based upon the specific point of the semiconductor substrate being tested, the robotic arm could be adjusted in order to assure the angle of incidents and reflections are appropriate in order to be properly detected by the detector 210.

Figure 2:
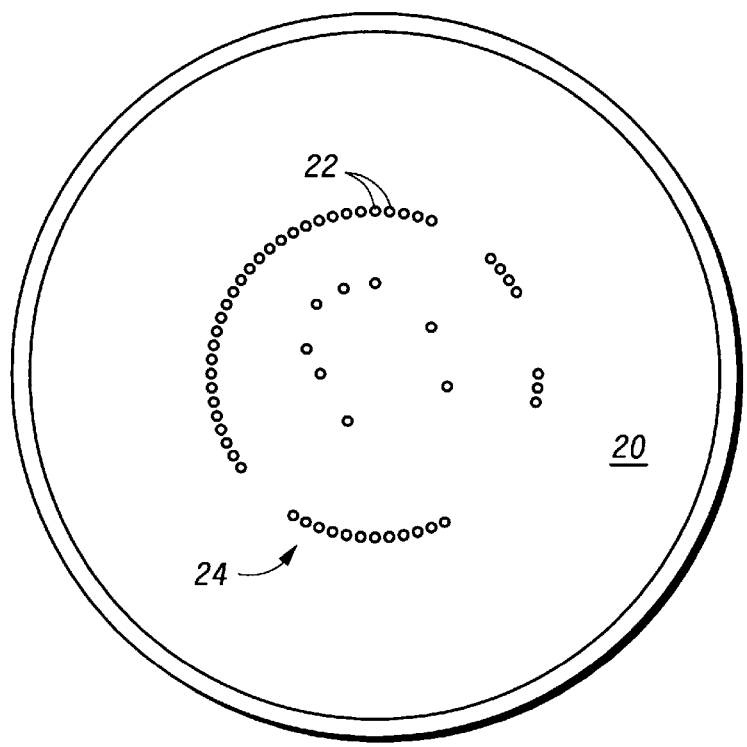

As previously discussed with reference to prior art FIGS. 1 and 2, chucks which hold semiconductor substrates tend to have a contamination signature which is repeatable. Therefore, the present invention also anticipates the backside contamination on a wafer as the result of individual processing chucks. Once the contamination signature of a chuck has been determined, it would be possible to perform a modified data acquisition, whereby only the data points or surface areas which are known to be part of the contamination signature would actually be tested for contamination. By doing so, the overall throughput of the backside metrology system could be greatly improved, and may also be rendered more accurate.

Figure 5:
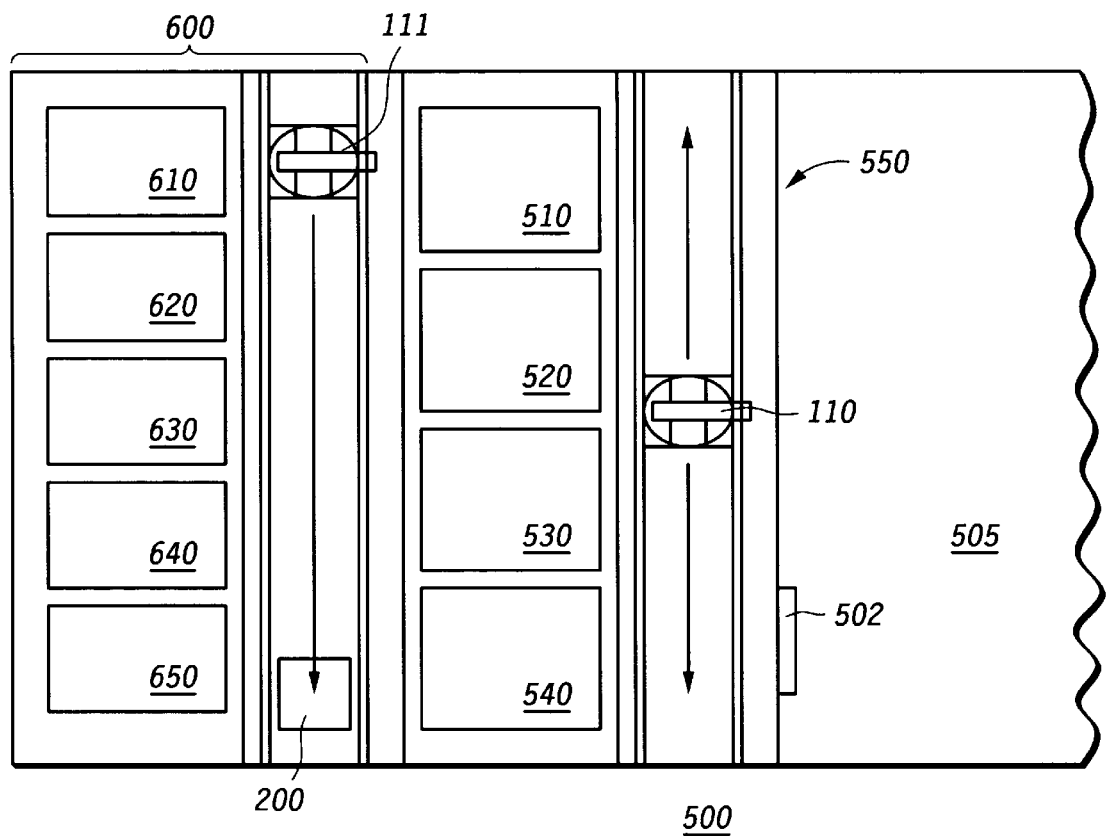
FIG 5 illustrates, in plan view, a tool for processing semiconductor wafers in accordance with the present inventions.

FIG. 5 illustrates a plan view of a semiconductor processing station 500 which would contain the backside metrology subsystem shown in FIG. 4. Specifically, the robotic mechanism 110 is illustrated as residing upon a track 550 in FIG. 5. FIG. 5 illustrates both the possible embodiments. A first embodiment being where the backside metrology subsystem is mounted on the robotic mechanism 110 and mobile with the mechanism 110. The second embodiment being where the backside metrology subsystem is stationary in a station 200 wherein the mechanism 110 must move the station 200 between chambers in order to perform particle detection as specific points during processing.

At one end of the track, a station 200 for the backside metrology system is illustrated for the second embodiment. In this second embodiment, a semiconductor substrate, upon being removed by one of the processing chambers 510, 520, 530, or 540, would be transported along the track by the robotic arm 110 to the stationary backside metrology station 200 for backside contamination analysis. In a third embodiment, the backside metrology subsystem 100 would actually reside at or within the location of one of the processing chambers 510–540. For example, the chamber 540 could actually be the equivalent of the backside metrology station 200 of FIG. 5. In the first embodiment, the robotic system 100 is the system of FIG. 4 including the connections 214 and 224, and controller 230 whereby the backside metrology subsystem is mobile with the robotic system 110 from chamber to chamber. In this configuration, particle detection and computer particle data storage may be done while the wafer is being transferred between different processing chambers 510–540 thereby potentially increasing throughput.

FIG. 5 illustrates an input or wafer carrier section 600 which has its own robotic system 111 which is similar to robotic system 110 in that the system 111 may also have access to a backside metrology subsystem using one of the three embodiments discussed above. The robotic system 111 moves wafers from a wafer carrier input regions 610–650 to the processing chamber environment which includes chambers 510–540.

FIG. 5 also illustrates a lithographic exposure chamber 505 which contains its own robotic system different from the systems 110 and 111. Exchange between the robotic system 110 and the system 505 occurs through a pass-through region 502 whereby robotic control changes from one system to another. Therefore, the system of FIG. 5 which illustrates a multi-chamber processing tool for lithographically processing wafers, is capable of performing in situ particle detection and computer processing and storage of contamination data.

Figure 6:
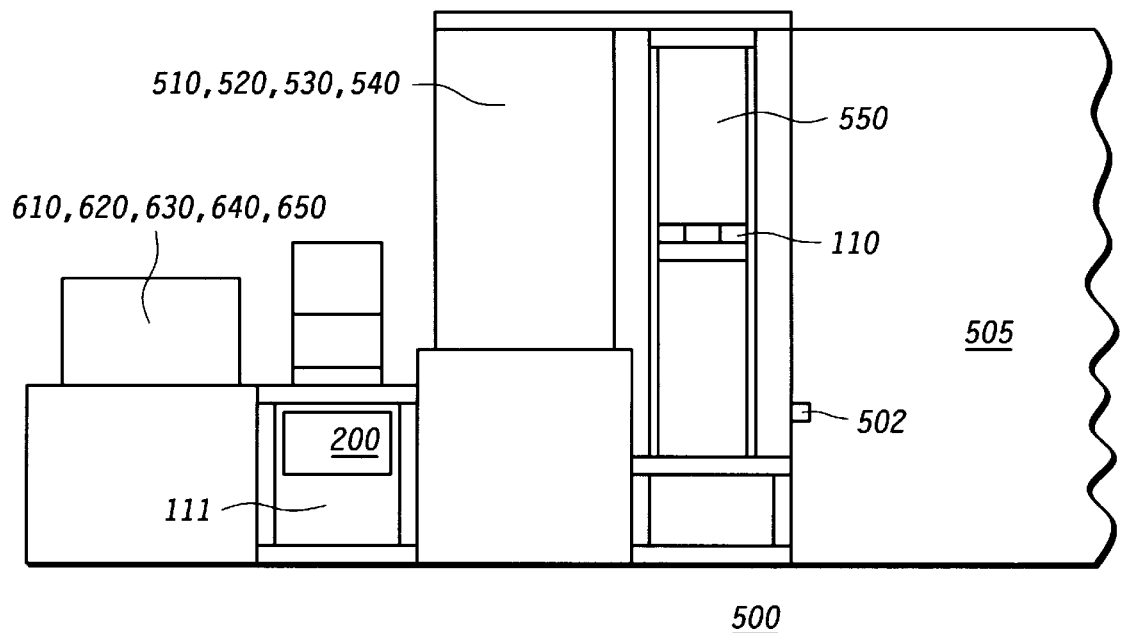
FIG. 6 illustrates, in cross sectional view, the tool of FIG. 5.

FIG. 6 illustrates a cross sectional view of a processing system which would contain a backside metrology subsystem. The first embodiment attaches the backside metrology subsystem to the movable robotic systems/arms 110 and 111 as previously discussed. The illustration of FIG. 6 shows the backside metrology subsystem 200 residing at a lower portion of the overall system 500 as is used for use in the second embodiment. In yet a third embodiment, an entire chamber 510–540 may be used solely as a in situ metrology chamber. One reason for providing the system 200 at a lower portion of the overall system would be that it is advantageous to limit the amount of diffused light which would reach the backside metrology subsystem, since the imposition of diffused light could effect the contamination readings of the laser device. In fact, regardless of the location of the subsystem of the backside metrology subsystem within the tool, it would be important to limit the amount of diffused light upon the tool. This is an advantage over the prior art, in that the prior art required specifically designed tools that provided chamber systems, or robotic systems, that were operator accessible and visible in order for visual inspections to occur. This allows for similar design of the tools which are more processing focused as opposed to the prior art, whereby the operator-friendly characteristics to support visual inspections were important.

Figure 7:
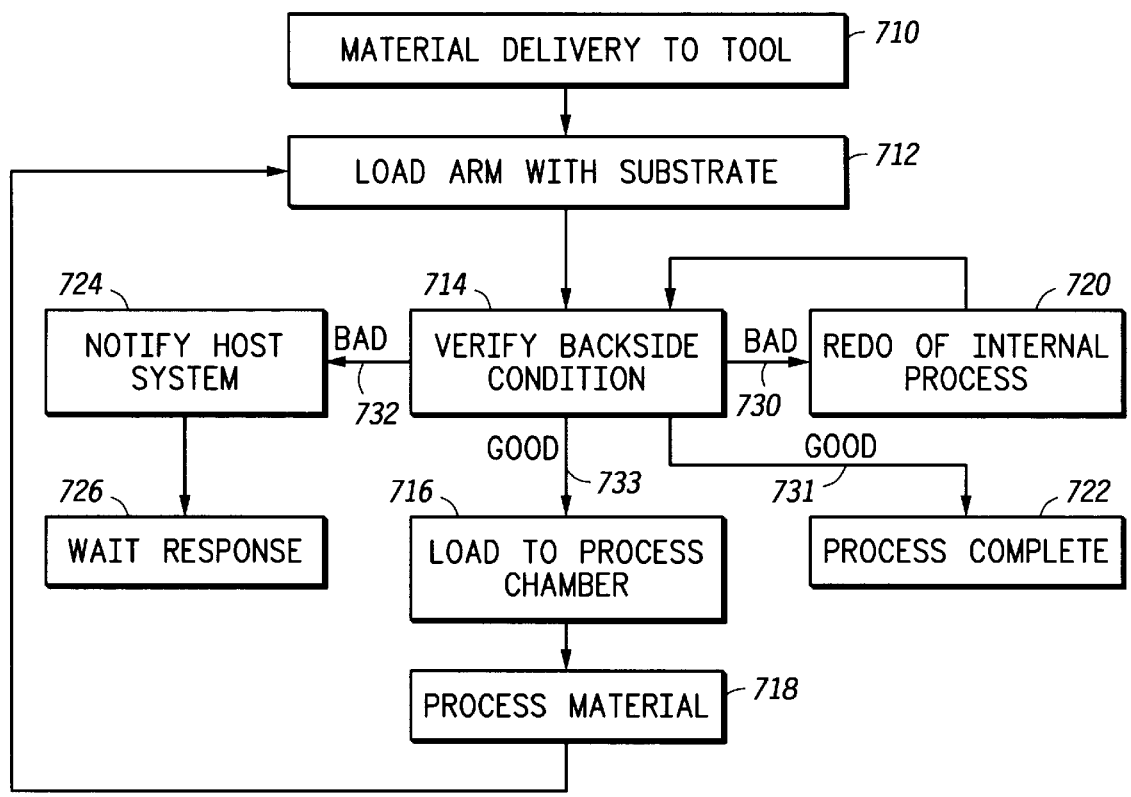
FIG. 7 illustrates a flow diagram of implementing an embodiment of the present invention.

FIG. 7 illustrates a flow 700 for using the present invention. Specifically, at step 710 of flow 700, material (e.g., a wafer substrate) would be delivered to a tool, such as tool 500, using a wafer carrier. The robotic arm would be loaded at step 712, with a semiconductor substrate/wafer. In one embodiment, prior to being introduced into a processing chamber, it would be advantageous to determine whether or not the backside of the semiconductor substrate is contaminated at the time of entry to get an initial contamination point. Therefore, at step 714, the semiconductor substrate would be introduced into the backside metrology system. Whereby the metrology system can be a fixed station requiring robotics to pass over the metrology system or the metrology system can be part of the robotics as previously described.

Based upon the specific process implemented by the processing tool, one of several events can occur when backside contamination is detected. Along a flow path 730, a "redo" process of some internal process upon the wafer would occur when a backside contamination condition is detected. In other words, if a photoresist spinning step results in excessive backside contamination, then the wafer would be cleaned and then reprocessed (redo) through the same step in the hope of obtaining a better backside contamination result. Also, that particular "problem chamber" may be shut down for cleaning before the redo is performed in an attempt to increase the likelihood of a successful redo. The cleaning would generally be a manual cleaning step. Such a redo condition could include a backside solvent strip followed by a re-verification step (e.g., more particle detection done in situ) to determine whether or not the redo was successful. Typical first pass "re dos" involve one or more of a deionized (DI) water rinse, or an organic solvent spray or bath within the processing tool.

In the event the redo 730 of the internal processing step was not able to resolve the issue, a more aggressive cleaning step could occur (e.g., an ex situ megasonic clean, a piranha clean using $H_2O_2$ and $H_2SO_4$ heated to roughly 120° C., or a alkali-amine solvent clean heated to approximately 90° C.). As an alternative to this more aggressive clean, the wafer could be processed along a process flow path 732 whereby the host system and operator are notified and a response is waited for at step 726. The response 726 may be a chamber clean process or some other sort of maintenance needed to bring the chamber into specification. In the event a good wafer is detected (i.e., backside contamination is within an acceptable threshold), the wafer would proceed along a path 733 and be loaded into a processing chamber for a subsequent processing step. Following the processing of the material at step 718, the wafer would be loaded again onto the arm of the robotic tool at step 712. By repeating the verification of the backside condition at step 714, another determination will be made whether the wafer backside condition is good or bad after the previous processing is complete. When the condition is good, processing would either continue at other chambers or the process flow would progress along a path 731 whereupon the process would be complete.

Figure 8:
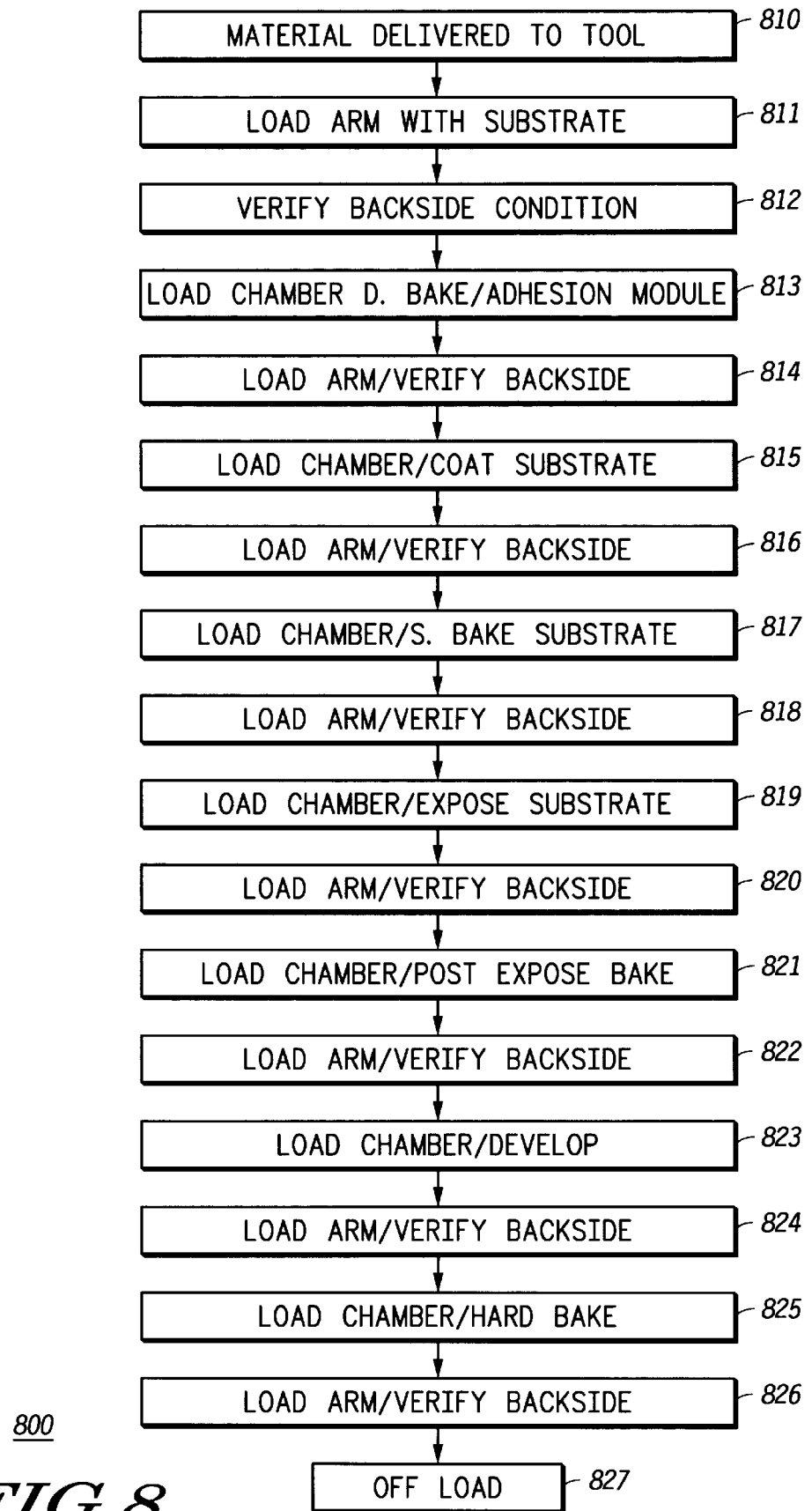
FIG. 8 illustrates a flow diagram of implementing another embodiment of the present invention.

FIG. 8 illustrates a specific method utilizing the present invention for a photolithography process 800. The flow 800 begins at step 810 where a material is delivered to the processing tool from an external source. In general, the material would include a wafer carrying device containing individual semiconductor wafers to be processed. Next, at a step 811, a substrate that has been delivered to the tool at step 810 is loaded onto the robotic arm by a robotics system. Next, at step 812, the robotic arm moves into position in order to verify the backside condition of the wafer. Next, at step 813, the semiconductor substrate is loaded into a dehydration bake and adhesion module. Following the of step 813, the robotic arm will load the semiconductor wafer and once again and move within the processing tool to verify whether backside contamination has occurred.

Following the step 814 of determining backside contamination, the robotic arm loads the semiconductor substrate into another processing chamber whereby a photoresist coating is applied at step 815. Next, at step 816, the robotic arm loads the substrate from the coating chamber of step 815 and once again verifies whether backside contamination has occurred. Each step of determining or verifying whether backside contamination has occurred (812, 814, 816, 818, 820, 822, 824, and 826), includes data gathering by a data processing system, such as a computer or controller, which stores this information and compares it to previous information and baseline information to determine whether contamination has occurred. Next, at step 817, the robotic arm loads the semiconductor wafer into a chamber for a soft bake process. Subsequently, at step 818, the semiconductor substrate is loaded onto the robotic arm and a determination is made whether or not the backside of the semiconductor substrate has been contaminated. Next, at step 819, the substrate is transported once again by the robotic arm to a processing chamber in order to expose the substrate to specific photographic images. Subsequently at step 820, the robotic mechanism will load the substrate for transportation in order to determine whether or not backside contamination occurred at step 819. Next, at step 821, the semiconductor substrate is transported into a processing chamber in order to perform a post-exposure bake. Next, at step 822, the semiconductor substrate is removed from the post-exposure bake processing chamber and transported once again to verify whether or not backside contamination has occurred. At a step 823, the semiconductor substrate is transported to a developing chamber. At step 824, the semiconductor substrate is removed from the developing chamber and transported to determine whether or not backside contamination has occurred. At step 825, the semiconductor substrate is transported to a hard bake processing chamber. Subsequently, at step 826, the semiconductor substrate is loaded by the robotic arm and transported once again in order to determine whether or not backside contamination has occurred. At a final step 827, the robotic arm transports the semiconductor substrate to be off-loaded from the processing tool.

It should be noted that during the flow 800, there may be a number of determination steps of the type discussed with reference to FIG. 7 whereby the process flow may be interrupted depending upon whether or not a contamination is detected by one of the backside contamination verification steps of the flow of FIG. 8.

It should be noted that this is an advantageous flow over the prior art in that it allows for real-time detection of contamination on a process chamber-by-process chamber basis. In other words, when a specific process chamber begins to contaminate a wafer, the contamination would be detected early, thereby identifying the chamber as a contamination source. This is an advantage over the prior art where periodic cleaning steps are generally performed at a random basis as a preventative measure. The present invention provides a deterministic method of monitoring wafer and chamber contamination, minimizes the number of wafers contaminated by preventing processing in contaminated chambers, and identifies the contaminated chamber for cleaning. By maintaining a database on the contamination levels of individual wafers and chambers, a history is generated which can be used to ensure the quality of the wafers and chambers.

While the present invention has been illustrated and described with reference to specific embodiments, further modifications and improvements will occur to those skilled in the art. For example, other types of contamination may be detected besides particulates, for example chemical contamination including elemental and molecular contamination. It is to be understood, therefore, that this invention is not limited to the particular use illustrated and that it is intended in the appended claims to cover all modifications that do not depart from the spirit and scope of this invention.

What is claimed is:

1. A method for processing a semiconductor wafer using a semiconductor processing tool, the method comprising the steps of:

placing the semiconductor wafer onto a robotic arm within a semiconductor wafer processing tool;

placing the semiconductor wafer into a processing chamber of the semiconductor processing tool by moving the robotic arm to the processing chamber;

processing the semiconductor wafer in the processing chamber;

removing the semiconductor wafer from the processing chamber using the robotic arm, the robotic arm exposing a backside portion of the semiconductor wafer when the semiconductor wafer is placed onto the robotic arm; and contaminant scanning the backside portion of the semiconductor wafer within the semiconductor processing tool by scanning the backside portion of the semiconductor wafer with an energy source, the contaminant scanning being used to determine if the backside portion of the semiconductor wafer was contaminated during processing in the processing chamber.

2. The method of claim 1 wherein the step of contaminant scanning comprises:

scanning the backside portion of the semiconductor wafer using a laser which scans of the backside portion of the semiconductor wafer and is detected by a detector.

3. The method of claim 2 wherein the step of contaminant scanning comprises:

contaminant scanning in a region of the semiconductor processing tool where the detector is substantially shielded from ambient light.

4. The method of claim 1 wherein the step of placing the semiconductor wafer onto a robotic arm comprises:

providing the robotic arm as a portion of a track that interfaces with a plurality of processing chambers within the semiconductor processing tool.

5. The method of claim 1 wherein the robotic arm used in the step of placing is a first robotic arm and the robotic arm used in the step of removing uses a second robotic arm.

6. The method of claim 1 wherein the semiconductor wafer has a diameter of at least 300 mm and the step of processing comprises:

patterning a line width on the semiconductor wafer having a dimension less than or equal to 0.25 microns.

7. The method of claim 1 wherein the energy source is physically mounted onto the robotic arm so that the energy source moves with the robotic arm.

8. The method of claim 1 wherein the energy source is physically decoupled from the robotic arm so that robotic arm moves into close proximity with the energy source before the step of contaminant scanning can occur.

9. The method of claim 1 wherein the energy source provides a laser beam which is reflected off of the semiconductor wafer and detected by a detector, wherein the energy source and the detector are movable under automated motor control for raster scanning across the backside portion of the semiconductor wafer.

10. The method of claim 1 wherein the energy source is a laser and wherein the robotic arm moves while the backside portion of the semiconductor wafer is being irradiated with the laser to enable contaminant scanning of the backside portion of the semiconductor wafer.

11. The method of claim 1 further comprising the steps of:

determining if contamination on the backside portion of the semiconductor wafer is out-of-specification; and cleaning the semiconductor wafer if the backside portion of the semiconductor wafer is out-of-specification.

12. The method of claim 11 wherein the step of cleaning comprises:
cleaning the backside portion of the semiconductor wafer while not disturbing an active side of the semiconductor wafer.

13. The method of claim 11 wherein the step of cleaning comprises:
cleaning the backside portion using a cleaning environment selected from a group consisting of:
an organic solvent, and deionized water.

14. The method of claim 11 wherein the step of cleaning comprises:
cleaning the backside portion using a cleaning environment selected from a group consisting of:
sonic-activated cleaning, a combination of $H_2O_2$ and $H_2SO_4$, and an alkali-amine solvent.

15. The method of claim 1 wherein the semiconductor processing tool contains a plurality of robotic arms wherein each robotic arm in the plurality of robotic arms exposes a backside of the semiconductor wafer for contaminant detection.

16. The method of claim 1, wherein the step of contaminant scanning includes:
contaminant scanning the backside portion of the semiconductor wafer to detect particle contamination.

17. The method for claim 1, wherein the step of contaminant scanning includes:
contaminant scanning the backside portion of the semiconductor wafer to detect chemical contamination.

18. The method of claim 1, wherein the step of contaminant scanning includes:
contaminant scanning the backside portion of the semiconductor wafer to detect physical defects.

19. A method for processing a semiconductor wafer using a semiconductor processing tool, the method comprising the steps of:
removing the semiconductor wafer from a semiconductor wafer carrier that is attached to the semiconductor processing tool;
placing the semiconductor wafer into a first process chamber of the semiconductor processing tool, the semiconductor wafer being coated with photosensitive material within the first process chamber;
removing the semiconductor wafer from the first process chamber using a robotic system; and
performing in situ contaminant detection on an exposed backside of the semiconductor wafer using the robotic system.

20. The method of claim 19 further comprising the steps of:
placing the semiconductor wafer into the semiconductor wafer carrier.

21. The method of claim 19 further comprising the steps of:
computer storing a contaminant detection information measured following the step of performing in situ contaminant detection.

22. The method of claim 21, further comprising the step of:
determining if the semiconductor wafer is contaminated based upon the contaminant detection information.

23. The method of claim 22, further comprising the step of:

cleaning a backside of the semiconductor wafer if the step of determining determines the semiconductor wafer is contaminated; and
placing the semiconductor wafer in the semiconductor wafer carrier when the step of determining determines the semiconductor wafer is not contaminated.

24. The method of claim 22, further comprising the step of:
cleaning a backside of the semiconductor wafer if the step of determining determines the semiconductor wafer is contaminated
placing the semiconductor wafer into a second process chamber of the semiconductor processing tool.

25. The method of claim 22 wherein the robotic system comprises a plurality of robotic arms within the semiconductor processing tool.

26. The method of claim 25 wherein at least one robotic arm in the plurality of robotic arms has an energy source and detector physically attached for performing the step of contaminant detection on the backside of the semiconductor wafer.

27. A method for processing a semiconductor wafer using a semiconductor processing tool, the method comprising the steps of:
processing the semiconductor wafer in a processing chamber located within the semiconductor processing tool;
removing the semiconductor wafer from the processing chamber using a robotic arm, the robotic arm exposing a backside portion of the semiconductor wafer when the semiconductor wafer is placed onto the robotic arm; and
in situ contaminant scanning a predetermined region on the backside portion of the semiconductor wafer, the predetermined region being an area of the backside of the semiconductor wafer which is most likely to be contaminated.

28. A method for processing a semiconductor wafer using a semiconductor processing tool, the method comprising the steps of:
processing the semiconductor wafer in a processing chamber;
removing the semiconductor wafer from the processing chamber using a robotic interface, the robotic interface having: (1) a robotic arm which enables physical movement of the semiconductor wafer; (2) means for supporting the semiconductor wafer during movement; (3) a laser source physically connected to the robotic arm so that the laser source moves with the robotic arm; (4) and a detector physically connected to the robotic arm so that the detector moves along with the robotic arm; and (5) movement means for moving at least one of the laser source or the detector to scan a backside of the semiconductor wafer when the semiconductor wafer is being supported by the means for supporting;
in situ contaminant scanning the backside of the semiconductor wafer using the laser source and the detector within the semiconductor processing tool; and
cleaning the semiconductor wafer if the step of in situ contaminant scanning indicates that the semiconductor wafer contains backside contamination beyond a specified threshold.

29. A semiconductor wafer processing tool comprising:
a plurality of process chambers;
a semiconductor wafer carrier region;

a robotic system for transferring semiconductor wafers between the plurality of process chambers and the semiconductor wafer carrier region, the robotic system having at least one robotic motion unit comprising:

a robotic arm;

means for supporting a semiconductor wafer coupled to the robotic arm;

a laser coupled to the robotic arm so that the laser follows the robotic arm as the robotic arm moves between chambers in the plurality of process chambers, the laser being adapted to direct a laser beam at a backside of a semiconductor wafer when the semiconductor wafer is supported by the means for supporting;

laser movement means for moving the laser in order to scan the laser along a backside of a semiconductor wafer that is supported by the means for supporting; and a detector coupled to the robotic arm so that the detector follows the robotic arm as the robotic arm moves between chambers in the plurality of process chambers, the detector being adapted to receive laser reflection from the backside of the semiconductor wafer when the semiconductor wafer is supported by the means for supporting; and computer means coupled to the semiconductor wafer processing tool for storing and processing semiconductor wafer contaminant data detected by the detector.

30. A method for processing a semiconductor wafer using a semiconductor processing tool, the method comprising the steps of:

removing the semiconductor wafer from a semiconductor wafer carrier that is attached to the semiconductor processing tool;

performing in situ contaminant detection on an exposed backside of the semiconductor wafer using a robotic system;

placing the semiconductor wafer into a first process chamber of the semiconductor processing tool, the semiconductor wafer being coated with an adhesion-promoting material within the first process chamber;

removing the semiconductor wafer from the first process chamber using the robotic system;

performing in situ contaminant detection on an exposed backside of the semiconductor wafer using the robotic system;

placing the semiconductor wafer into a second process chamber of the semiconductor processing tool, the semiconductor wafer being coated with photosensitive material within the second process chamber;

removing the semiconductor wafer from the second process chamber using the robotic system;

performing in situ contaminant detection on an exposed backside of the semiconductor wafer using the robotic system;

placing the semiconductor wafer into a third process chamber of the semiconductor processing tool, the semiconductor wafer being baked within the third process chamber;

removing the semiconductor wafer from the third process chamber using the robotic system;

performing in situ contaminant detection on an exposed backside of the semiconductor wafer using the robotic system;

placing the semiconductor wafer into a fourth process chamber of the semiconductor processing tool, the semiconductor wafer being lithographically exposed within the fourth process chamber;

removing the semiconductor wafer from the fourth process chamber using the robotic system; and performing in situ contaminant detection on an exposed backside of the semiconductor wafer using the robotic system.

31. The method of claim 30 further comprising the steps of:

placing the semiconductor wafer into a fifth process chamber of the semiconductor processing tool, the semiconductor wafer being baked in the fifth process chamber;

removing the semiconductor wafer from the fifth process chamber using the robotic system; and performing in situ contaminant detection on an exposed backside of the semiconductor wafer using the robotic system.

32. The method of claim 30 further comprising the steps of:

placing the semiconductor wafer into a sixth process chamber of the semiconductor processing tool, the semiconductor wafer being developed in the sixth process chamber;

removing the semiconductor wafer from the sixth process chamber using the robotic system; and performing in situ contaminant detection on an exposed backside of the semiconductor wafer using the robotic system.

33. The method of claim 30 further comprising the steps of:

placing the semiconductor wafer into a seventh process chamber of the semiconductor processing tool, the semiconductor wafer being hard baked in the seventh process chamber;

removing the semiconductor wafer from the seventh process chamber using the robotic system; and performing in situ contaminant detection on an exposed backside of the semiconductor wafer using the robotic system; and placing the semiconductor wafer into the semiconductor wafer carrier.

34. The method of claim 30 wherein the step of removing comprises:

performing contaminant detection on the semiconductor wafer before processing the semiconductor wafer in the first process chamber to obtain a baseline of backside contamination.

35. The method of claim 30 wherein the step of performing the in situ contaminant detection further comprises:

performing the in situ contaminant detection by placing the semiconductor wafer in a contamination detection chamber.

36. The method of claim 30 wherein the step of performing the in situ contaminant detection further comprises:

performing the in situ contaminant detection by using the robotic system, wherein the robotic system has an energy source and detector physically attached for performing the steps of contaminant detection on the backside of the semiconductor wafer.

37. The method of claim 30 wherein the steps of removing further comprise:

removing the semiconductor substrate using one of a plurality of robotic arms within the semiconductor processing tool.

38. The method of claim 37, wherein a first robotic arm passes the semiconductor wafer to a second robotic arm after processing in the third process chamber and before processing in the fourth process chamber.

39. The method of claim 30, wherein a step of cleaning is performed if one of the contaminant detection steps determines that a contaminant contamination level on a backside of the semiconductor wafer is beyond a specified limit.

40. The method of claim 30, wherein each contaminant detection step stores a contaminant count value and a rate of contamination change value in a database in order to monitor semiconductor wafer contaminant history through the semiconductor processing tool.

* * * * *